United States Patent [19]

Satula et al.

[11] Patent Number: 5,255,807
[45] Date of Patent: Oct. 26, 1993

[54] CONTAINER

[75] Inventors: Keith O. Satula, New Berlin; Charles J. Turner, Milwaukee; John P. Groves, Waukesha, all of Wis.

[73] Assignee: Eaton Corporation, Cleveland, Ohio

[21] Appl. No.: 899,350

[22] Filed: Jun. 16, 1992

[51] Int. Cl.$^5$ ............................................. H02G 3/00
[52] U.S. Cl. .................................... 220/3.8; 220/331; 220/334; 16/364
[58] Field of Search ....................... 220/4.22, 3.8, 4.02, 220/331, 334; 16/362, 364

[56] References Cited

U.S. PATENT DOCUMENTS

| | | | |
|---|---|---|---|
| 342,404 | 5/1886 | Vollrath et al. | 16/364 X |
| 834,491 | 10/1906 | Reily | 16/364 |
| 2,032,221 | 2/1936 | Myers | 220/38 |
| 2,211,581 | 8/1940 | Ross | 16/364 |
| 2,610,857 | 9/1952 | Cook | 16/364 X |
| 2,792,143 | 5/1957 | Seeger | 220/4 |
| 3,682,348 | 8/1972 | Roberts | 220/331 |
| 3,716,815 | 2/1973 | Riches | 220/3.8 X |
| 4,048,050 | 9/1977 | Hillman | 220/281 X |
| 4,502,609 | 3/1985 | Christatos | 220/329 |
| 4,909,579 | 3/1990 | Liu | 312/208 |
| 5,040,857 | 8/1991 | Mandel et al. | 16/364 X |
| 5,065,878 | 11/1991 | Altmann et al. | 220/3.8 |
| 5,101,869 | 4/1992 | Myers | 220/334 X |

OTHER PUBLICATIONS

Rose, "Aluminum Watertight RFI Shielded 01", p. 5.
Eaton, Cutler-Hammer, "Instruction Publication 220A-6501 R G B Color Sensor", p. 1.

Primary Examiner—Steven M. Pollard
Attorney, Agent, or Firm—Tarolli, Sundheim & Covell

[57] ABSTRACT

An improved container includes a main section and a cover section which are interconnected by a hinge assembly. The hinge assembly allows the cover section to move toward and away from the main section along a linear path so that a seal is uniformly compressed completely around an opening in the main section. In addition, the hinge assembly allows the cover section to pivot relative to the main section. The hinge assembly includes a base portion which is fixedly secured to the main section of the container. A connector portion of the hinge assembly has a pair of hinge plates which are pivotally interconnected. A lower hinge plate is slidably received between the base portion of the hinge assembly and the main section of the container to accommodate linear movement of the cover section relative to the main section of the container. Stop surfaces on the lower hinge plate and the base portion of the hinge assembly limit the extent of linear movement of the cover section relative to the main section of the container. An upper hinge plate is pivotally connected to the lower hinge plate and cover section to accommodate pivotal movement of the cover section.

26 Claims, 4 Drawing Sheets

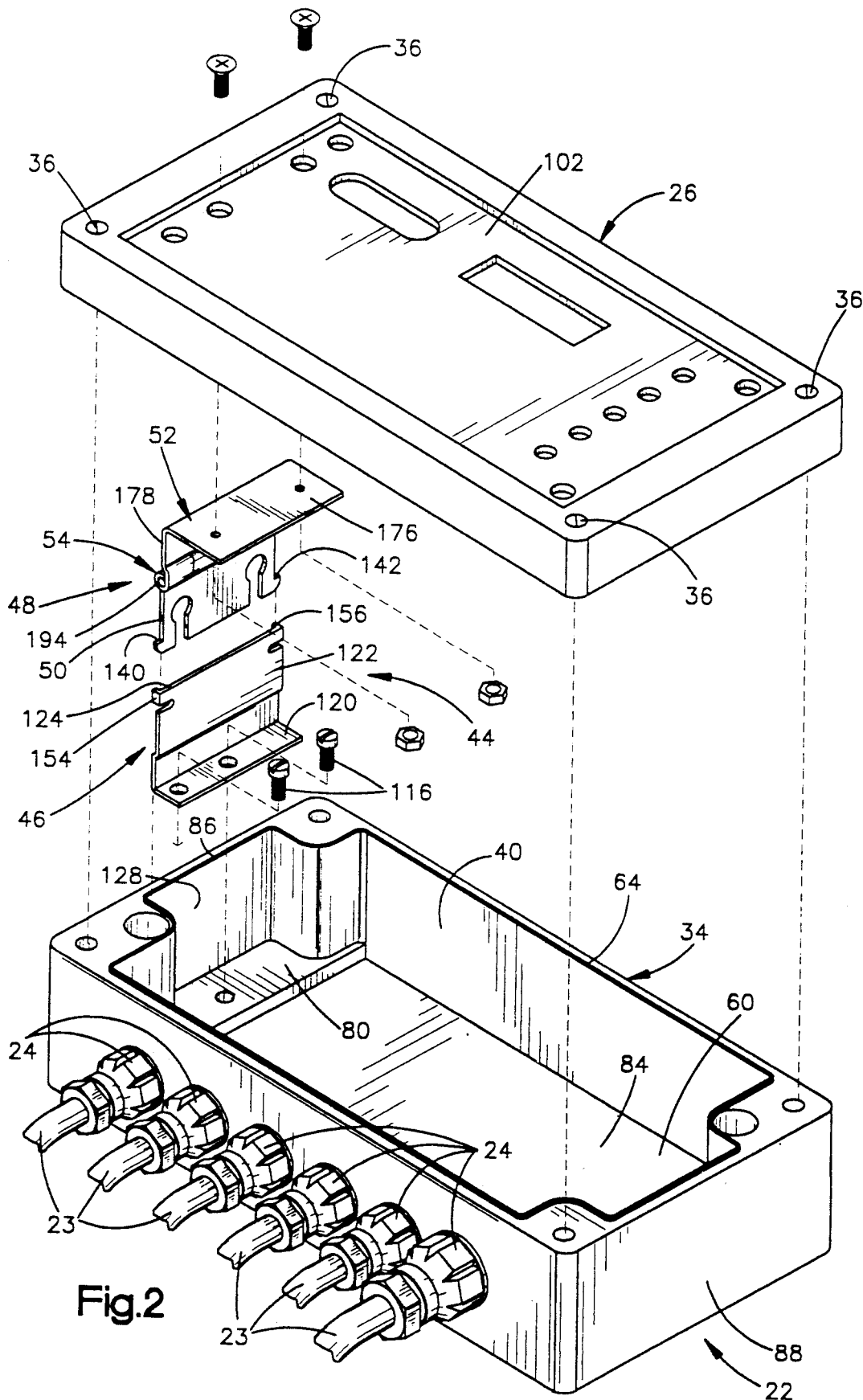

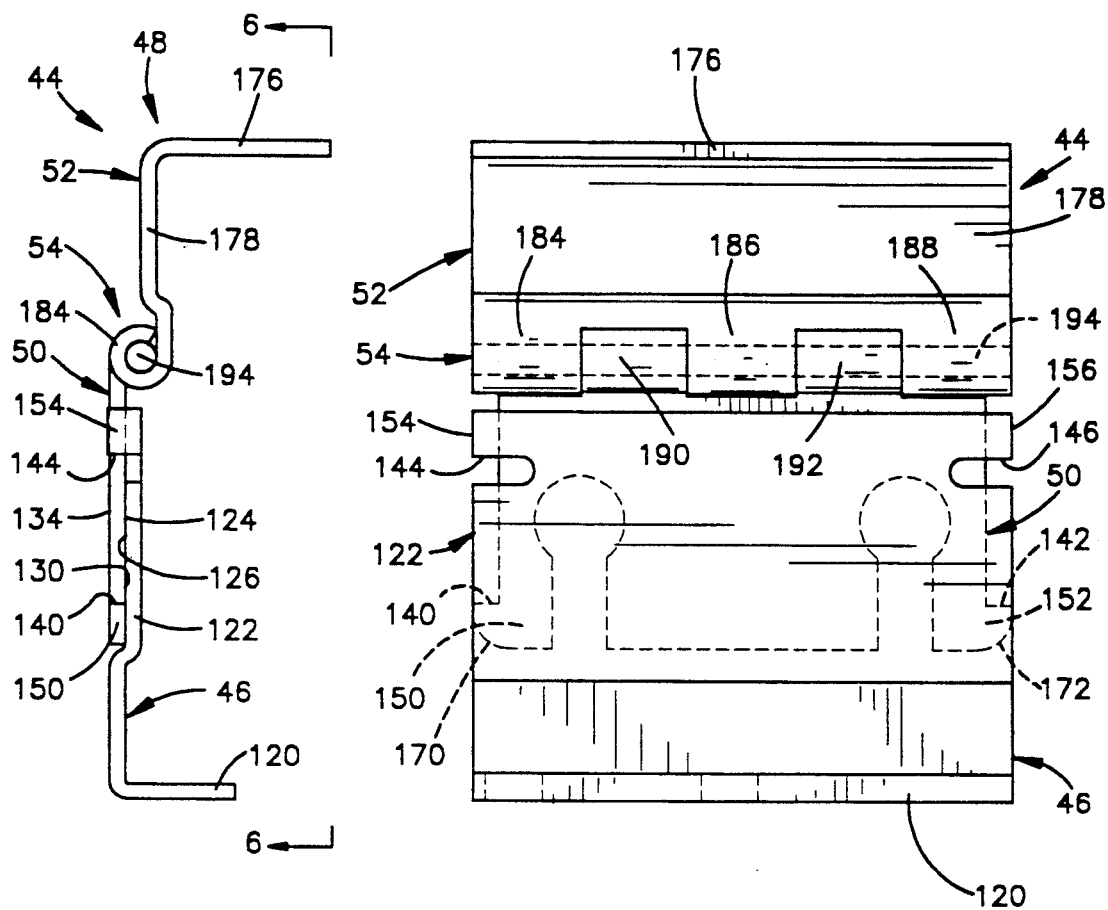
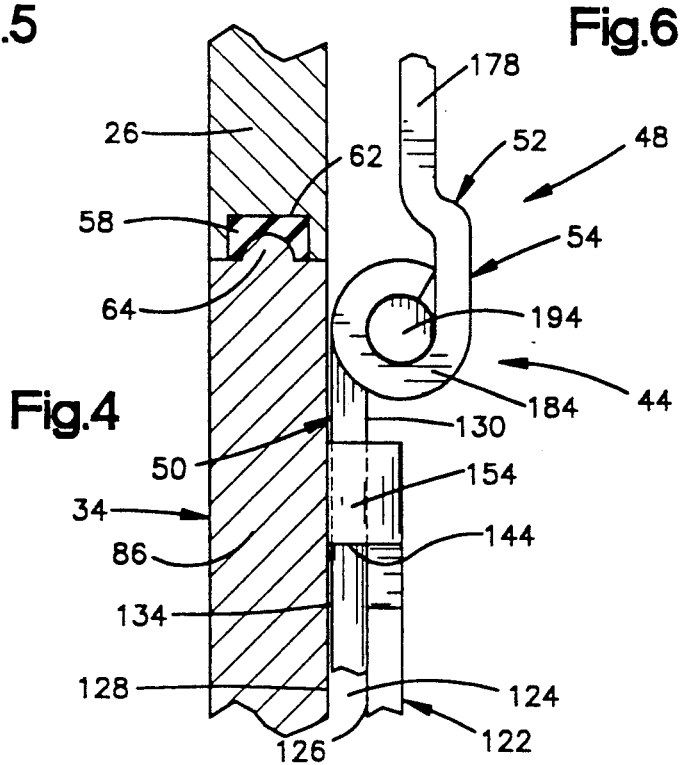

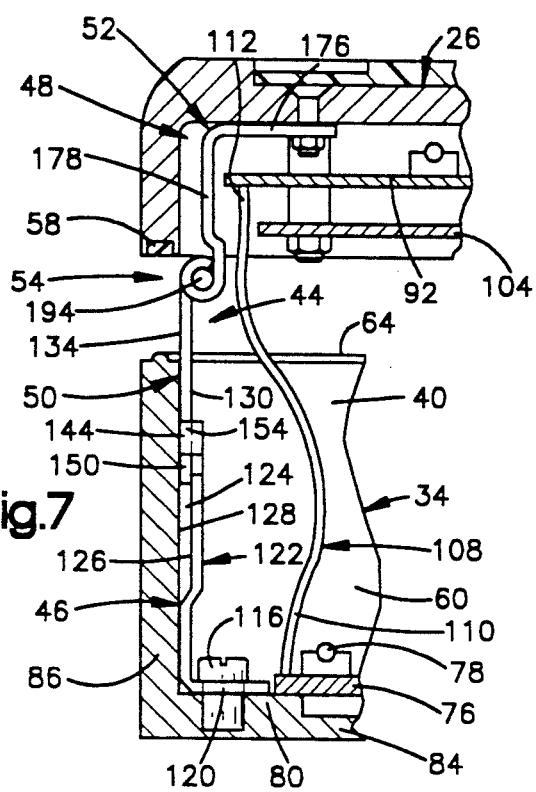
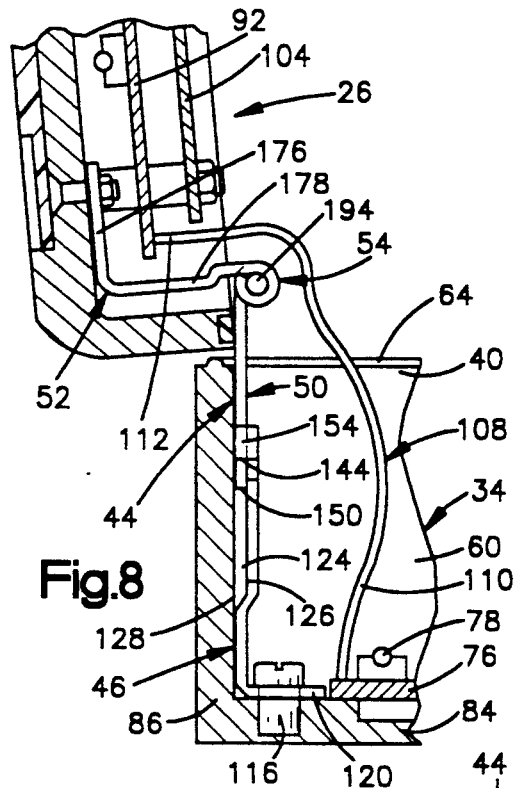
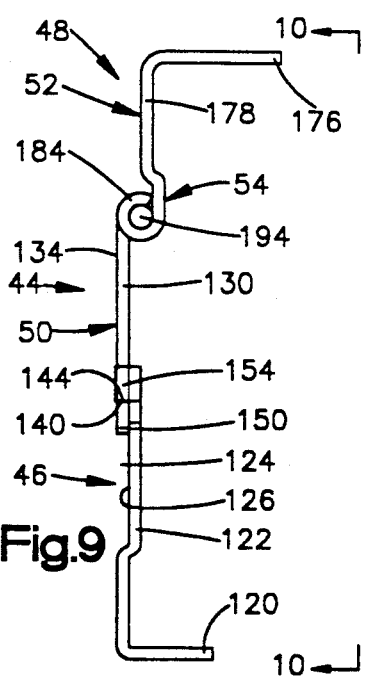
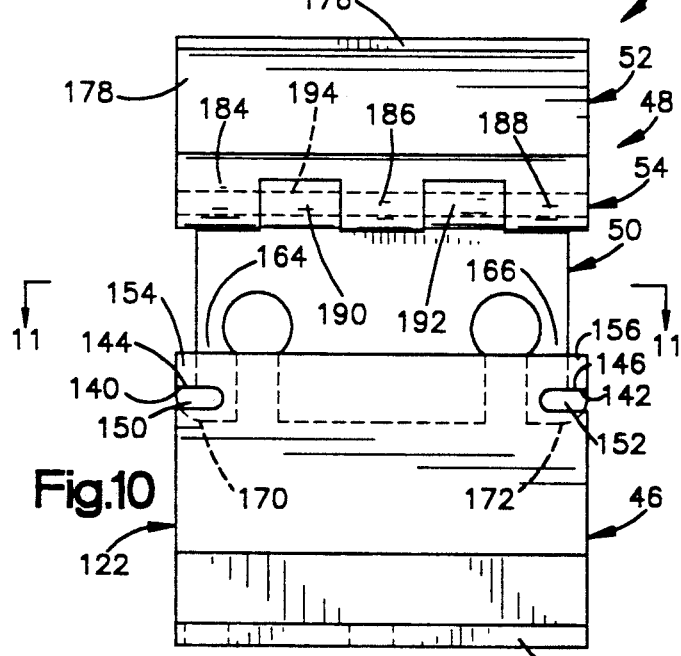
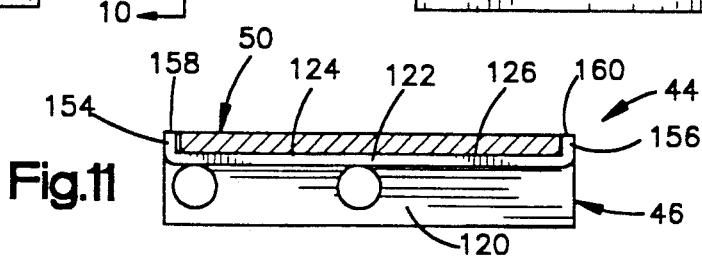

CONTAINER

BACKGROUND OF THE INVENTION

The present invention relates to an improved container. More specifically, the invention relates to a container which holds electrical circuitry and which has a hinge assembly interconnecting main and cover sections of the container.

A known container for electrical circuitry has a cover section and a main section. A seal between the cover and main sections prevents contaminants from entering the container. In order to obtain uniform compression of the seal when the container is closed, the cover section is attached to the main section by four screws, that is, one screw at each of the four corners of the rectangular container. Upon disconnection of the screws, the cover section is completely disconnected from and is freely movable relative to the main section of the container.

SUMMARY OF THE INVENTION

The present invention provides a new and improved container having a cover section which is connected with a main section of the container by a hinge assembly. The hinge assembly includes a base portion and a pair of hinge plates which are pivotally interconnected. A first one of the hinge plates is slidable along a linear path relative to the base portion of the hinge assembly. This allows the cover section to move along a linear path relative to the main section of the container. Linear movement of the cover section enables a seal between the cover section and main section of the container to be uniformly compressed upon closing of the container.

The two hinge plates are pivotally interconnected. This enables the cover section to be pivoted to an open position offset to one side of an opening in the main section of the container. When the cover section has been pivoted to the open position, electrical circuitry or other items within the container are readily accessible through the opening in the main section of the container.

BRIEF DESCRIPTION OF THE DRAWINGS

The foregoing and other features of the invention will become more apparent upon a consideration of the following description taken in connection with the accompanying drawings, wherein:

FIG. 2 is an exploded pictorial illustration of the container used in the controller of FIG. 1 with portions of the controller removed;

FIG. 4 is an enlarged fragmentary sectional view of a portion of FIG. 3 and illustrating the relationship of a seal and the hinge assembly to the main and cover sections of the container;

FIG. 5 is an enlarged side elevational view of the hinge assembly, the hinge assembly being shown in a retracted condition in which the container is closed;

FIG. 6 is an elevational view, taken generally along the line 6—6 of FIG. 5, further illustrating the hinge assembly;

FIG. 7 is a fragmentary sectional view of the container in a partially open condition in which the hinge assembly has been extended to move the cover section upwardly from the main section of the container;

FIG. 8 is a fragmentary sectional view, generally similar to FIG. 7, illustrating the relationship between the hinge assembly, main section and cover section of the container when the container is in a fully open condition;

FIG. 9 is an enlarged side view of the hinge assembly in the extended condition of FIG. 7;

FIG. 10 is a front elevational view, taken generally along the line 10—10 of FIG. 9, further illustrating the hinge assembly in the extended condition; and FIG. 11 is a sectional view, taken generally along the line 11—11 of FIG. 10, illustrating the manner in which a lower hinge plate of a connector portion of the hinge assembly is received in a channel which is partially formed by a base portion of the hinge assembly.

DESCRIPTION OF ONE SPECIFIC PREFERRED EMBODIMENT OF THE INVENTION

Figure 1:
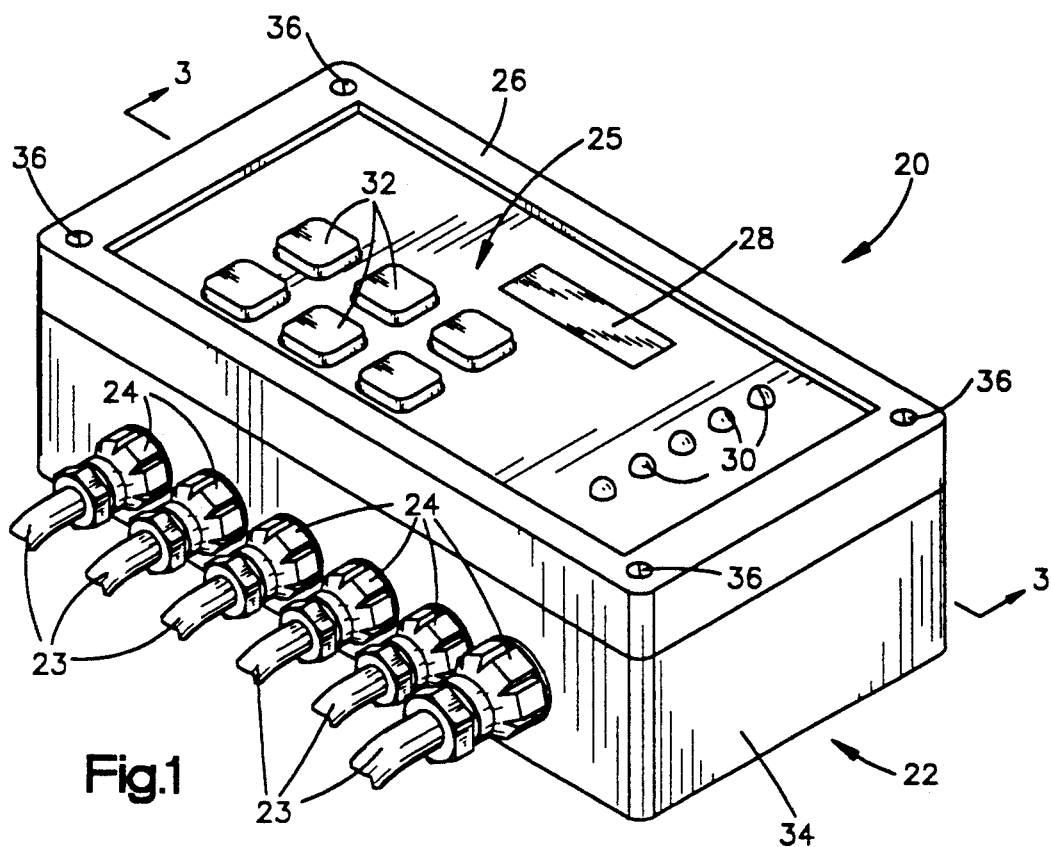
FIG. 1 is a simplified pictorial illustration of a controller having a container constructed in accordance with the present invention.

A controller 20 (FIG. 1) includes an improved container 22 to which conductors or cables 23 are attached by cable glands 24. The cables 23 conduct electrical signals to and/or from electrical circuitry in the container 22. A display panel 25 is mounted on a cover section 26 of the container 22. The display panel 25 has a window 28 over an alpha-numeric display. The display panel 25 also has light-emitting diodes 30 to provide information to an operator of the controller 20. A plurality of membrane switches 32 are built into the display panel 25 to enable information to be input to the electrical circuitry in the container 22.

The cover section 26 is secured to a rectangular main section 34 of the container 22 by a plurality of screws 36 (FIG. 1). Thus, a screw 36 is provided at each of the four corners of the container 22. The externally threaded screws 36 extend through the cover section 26 into internally threaded openings in the main section 34 to secure the cover section to the main section of the container 22.

Although it is contemplated that the improved container 22 could be utilized in many different controllers or in association with other types of devices, in the illustrated embodiment of the invention, the container 22 is used in a controller 20 for a color sensor. The color sensor provides a high speed on-line method of color quality assessment. A known color sensor controller is commercially available under the designation 220A-6501 R G B Color Sensor from Eaton, Cutler-Hammer, having a place of business at Milwaukee, Wis. However, it should be understood that the invention is not limited to any specific controller.

The cover section 26 closes a rectangular opening 40 (FIG. 2) formed in the upper end portion of the main section 34 of the container. A hinge assembly 44 (FIGS. 2 and 3) secures the cover section 26 to the main section 34 of the container 22. The hinge assembly 44 includes a base portion 46 which is fixedly secured to the main section 34 of the container 22 and a connector portion 48 which interconnects the cover section 26 and main section 34 of the container.

Figure 3:
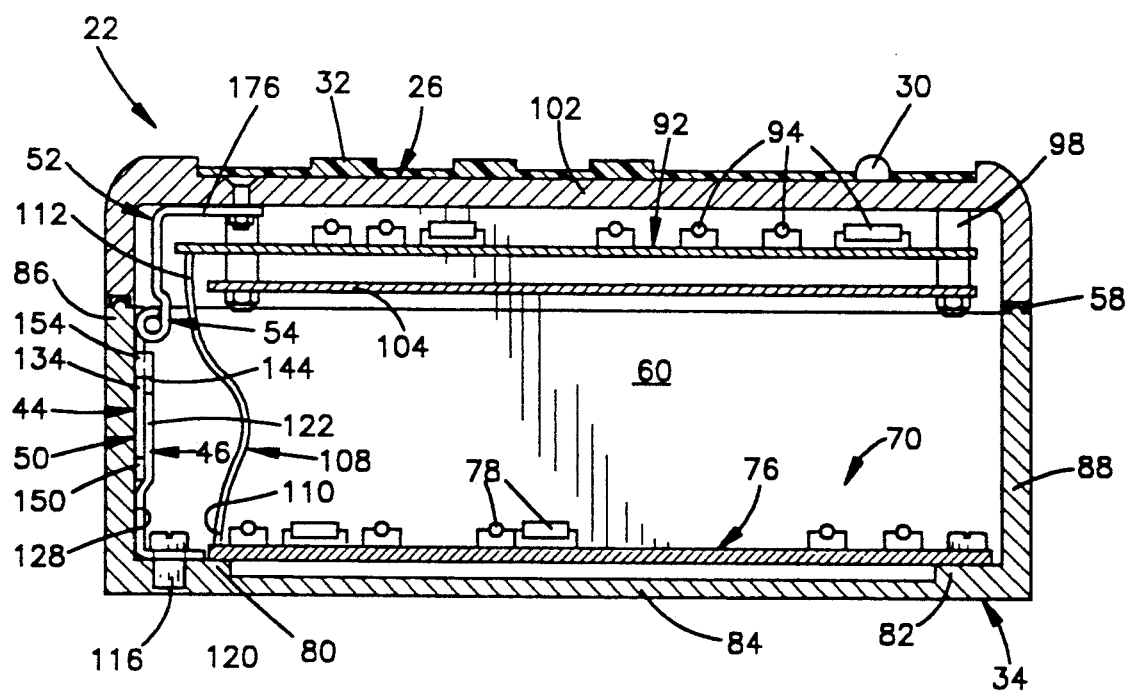
FIG. 3 is simplified schematic sectional view, taken generally along the line 3—3 of FIG. 1, with the container in a closed condition and illustrating the relationship of a hinge assembly to a main section and a cover section of the container with electrical circuitry in the container.

The connector portion 48 of the hinge assembly 44 includes upper and lower hinge plates or leaves 50 and 52 which are interconnected by a pivot connection 54. The lower hinge plate 50 is slidably connected with the main section 34 of the container 22 by the base portion 46 (FIG. 3). The upper hinge plate 52 is fixedly secured with the cover section 26.

CONTAINER

The screws 36 (FIG. 1) at the four corners of the container 22 press the cover section 26 and main section 34 firmly together when the container 22 is in the closed condition shown in FIGS. 1 and 3. When the container 22 is closed, a seal 58 (FIGS. 3 and 4) blocks entry of contaminants into a rectangular chamber 60 (FIGS. 2 and 3) in the container 22. The seal 58 provides an NEMA Class 4X seal against contaminants, such as dust and water.

By urging the cover section 26 and main section 34 together under the influence of the screws 36 at each of the corners of the container 22 (FIG. 1), uniform compression of the seal 58 is obtained completely around the opening 40 (FIG. 2) to the chamber 60. In the illustrated embodiment of the invention, the seal 58 is mounted in a recess 62 (FIG. 4) formed in the cover section 26. A rib 64 extends upwardly from the main section 34 and extends around the opening 40 to press the seal 58 in the recess 62 when the screws 36 are tightened.

The obtaining of a uniform seal completely around the opening 40 is facilitated by the fact that the hinge assembly 44 accommodates limited linear movement (FIGS. 3 and 7), as well as pivotal movement (FIGS. 7 and 8), of the cover section 26 relative to the main section 34 of the container 22. Therefore, when the screws 36 are tightened, the cover section 26 can be moved straight downwardly (as viewed in FIG. 3). This enables a uniform clamping action to be obtained against the seal 58 throughout the extent of the seal.

The seal 58 protects electrical circuitry 70 (FIG. 3) disposed in the main section 34 and electrical circuitry 72 disposed in the cover section 26 of the container 22. The electrical circuitry 70 includes a lower printed circuit board 76 upon which circuit components 78 are mounted. The cables 23 (FIG. 1) are connected with the lower printed circuit board 76 by electrical connectors (not shown).

The lower circuit board 76 is mounted on bosses or ledges 80 and 82 (FIG. 3) formed in the lower side wall 84 of the main section 34 of the container 22. The bosses 80 and 82 are disposed adjacent to opposite end walls 86 and 88 of the main section 34 of the container 22. The bosses 80 and 82 support the printed circuit board 76 in a spaced apart relationship with the bottom wall 84. The left (as viewed in FIG. 3) end portion of the printed circuit board has a recess which enables the base portion 46 of the hinge assembly 44 to be fixedly secured directly to the boss 80.

The electrical circuitry 72 in the cover section 26 contains the alpha numeric display covered by the window 28 connected with the display panel 25. The electrical circuitry 72 includes a rectangular upper printed circuit board 92 upon which electrical circuit components 94 are mounted. The upper printed circuit board 92 is mounted in a rectangular recess formed in the cover 26 and is electrically connected with the display panel 25. The upper printed circuit board 92 is supported by a plurality of bolts which engage the corners of the printed circuit board. The bolts extend through spacers 98 which hold the upper printed circuit board 92 in a spaced apart relationship with an upper wall 102 of the cover section 26.

A rectangular protector board 104 (FIG. 3) is mounted on the cover wall 102 by the same bolts which connect the printed circuit board 92 with the cover. The protector board 104 is spaced from and is coextensive with the printed circuit board 92. The protector board 104 prevents the printed circuit board 92 from being accidently damaged when the cover section 26 is in the open position.

A flexible electrical conductor 108 conducts electrical energy between the lower and upper printed circuit boards 76 and 92. In the illustrated embodiment of the invention, the electrical conductor 108 is a ribbon cable having a flat, flexible base formed of electrically insulating material in which conductor elements are embedded. A lower end portion 110 of the flexible electrical conductor 108 is connected with the lower printed circuit board 76. An upper end portion 112 of the flexible electrical conductor 108 is connected with the upper printed circuit board 92. The electrical conductor 108 is offset to one side of the hinge assembly 44.

Sufficient slack is provided in the flexible conductor 108 to enable the cover section 26 to move between the closed condition illustrated in FIG. 3, a partially open condition illustrated in FIG. 7, and a fully open condition illustrated in FIG. 8. As the cover section 26 is moved relative to the main section 34 from the closed condition to the partially open condition, the upper end portion 112 of the conductor 108 moves away from the lower end portion 110 of the conductor. As the cover section 26 is pivoted to the fully open condition, the upper end portion of the electrical conductor 108 moves still further away from the lower end portion 110 of the conductor. The slack in the electrical conductor 108 is sufficient to accommodate the relative movement between the cover section 26 and main section 34 of the container 22.

When the cover section 26 is in the partially open condition (FIG. 7), the left end portion of the cover section 26 is disposed above the main section 34 of the container. At this time, the cover section 26 may be horizontal (as shown in FIG. 7) or may be tilted downwardly so that the right (as viewed in FIG. 3) end portion of the cover section 26 engages or is closely adjacent to the main section 34 of the container 22. Once the cover section 26 has been moved to the partially open condition, the cover section is pivoted in a counterclockwise direction (as viewed in FIG. 7) to the fully open condition (FIG. 8). When the cover section 26 is in the fully open condition, the rectangular opening 40 is exposed to facilitate access to the chamber 60 in the lower section 34 of the container 22.

When the cover section 26 is in the fully open condition, the center of gravity of the cover section is disposed on the opposite side of the pivot connection 54 from the main section 34 of the container 22. Thus, the cover section 26 slopes upwardly and leftwardly, as viewed in FIG. 8, from the pivot connection 54 at an angle of approximately 5° from the vertical. Therefore, the cover section 26 is stable in the fully open position and remains fully open until it is moved toward the closed position.

When the fully open container 22 is to be returned to the closed condition, the cover section 26 is pivoted in a clockwise direction from the fully open position shown in FIG. 8 to the partially open position shown in FIG. 7. The cover section 26 is then moved vertically downwardly along a linear path toward the main section 34 of the container 22. As the cover section 26 moves straight downwardly, the seal 58 (FIG. 4) moves into engagement with the rib 64 on the main section 34 of the container.

As the screws 36 (FIG. 1) at the corners of the cover section 26 are tightened, the seal 58 is compressed by the rib 64 throughout the extent of the seal. Compressing the seal 58 provides a firm fluid tight seal between the cover section 26 and main section 34 of the container 22. Since the cover section 26 can be moved straight downwardly toward the main section 34 of the container 22, uniform compression of the seal 58 is obtained completely around the opening 40. Therefore, contaminants can not leak into the closed container 22.

HINGE ASSEMBLY

The hinge assembly 44 maintains the cover section 26 in a desired spatial relationship with the main section 34 of the container 22 during movement of the cover section between the fully open and closed conditions. The hinge assembly 44 also maintains the cover section 26 in a desired spatial relationship with the main section 34 when the cover section is in the fully open condition. The hinge assembly 44 allows the cover section 26 to be moved along a linear path relative to the main section 34 between the closed and partially open conditions of FIGS. 3 and 7. In addition, the hinge assembly 44 allows the cover section 26 to be pivoted along an arcuate path between the partially open and fully open conditions of FIGS. 7 and 8. During tightening of the retaining screws 36 at the corners of the container 22 (FIG. 1), the hinge assembly 44 allows straight downward movement of the cover section 26 so that the seal 58 is compressed in a uniform manner throughout the extent of the seal.

The one-piece base portion 46 of the hinge assembly 44 (FIGS. 5, 6, 9, and 10) is fixedly connected to the boss 80 (FIG. 3) by suitable fasteners 116. The base portion 46 cooperates with the lower hinge plate 50 to guide linear movement of the connector portion 48 of the hinge assembly relative to the main section 34 of the container 22 during movement of the cover section 26 between the partially open condition (FIG. 7) and closed condition (FIG. 3) and during tightening of the fasteners 36 (FIG. 1).

The base portion 46 includes a horizontal support section 120 which is connected to the boss 80 by the fasteners 116 (FIGS. 2 and 3). An upstanding body section 122 is disposed along the end wall 86 of the main section 34 of the container 22 (FIG. 3). The body section 122 of the base portion 46 cooperates with the end wall 86 of the main section 34 of the container 22 to form a channel 124 (FIGS. 4, 7 and 11) in which the lower hinge plate 50 is slidably received.

An outwardly facing major side surface 126 (FIG. 4) on the body section 122 extends parallel to and cooperates with an inwardly facing major side surface 128 on the container end wall 86 to at least partially form the channel 124. A flat inner major side surface 130 on the lower hinge plate 50 is disposed in flat abutting engagement with the outwardly facing major side surface 126 on the body section 122 of the base portion 46. Similarly, a flat outwardly facing major side surface 134 (FIGS. 4 and 5) on the lower hinge plate 54 is disposed in flat abutting engagement with the inwardly facing major side surface 128 (FIGS. 2 and 4) of the end wall 86.

During movement of the lower hinge plate 50 between the retracted position of FIGS. 3-6 and the extended position of FIGS. 7, 9 and 10 as the cover section 26 moves between the closed condition and the partially open condition, the major side surfaces 130 and 134 (FIGS. 7 and 9) on the lower hinge plate 50 cooperate with the base portion 46 and container end wall 86 (FIG. 7) to guide movement of the connector portion 48 of the hinge assembly 44. Thus, the inwardly facing major side surface 130 on the lower hinge plate 50 slides along the outwardly facing major side surface 126 on the base portion 46. Similarly, the outwardly facing major side surface 134 on the lower hinge plate 50 slides along the inwardly facing side surface 128 on the end wall 86 of the main section 34 of the container 22.

As the lower hinge plate 50 moves upwardly from the retracted position of FIGS. 3-6 to the extended position of FIGS. 7-10, a pair of stop surfaces 140 and 142 (FIG. 6) on the lower hinge plate 50 move upwardly toward a pair of stop surfaces 144 and 146 on the base portion 46. When the cover 26 has been moved to the partially open position shown in FIG. 7, the stop surfaces 140 and 142 on the lower hinge plate 50 are disposed in abutting engagement with the stop surfaces 144 and 146 on the base portion 46 (FIG. 10). This blocks further upward movement of the connector portion 48 of the hinge assembly 44 relative to the base portion 46 of the hinge assembly.

The stop surfaces 140 and 142 (FIG. 6) on the lower hinge plate 50 are formed on a pair of outwardly extending projections 150 and 152. The stop surfaces 140 and 142 are disposed in a horizontal plane which extends perpendicular to the path of sliding movement of the lower hinge plate 50 between the retracted position of FIGS. 5 and 6 and the extended position of FIGS. 9 and 10.

The stop surfaces 144 and 146 (FIG. 6) on the base portion 46 are disposed on a pair of stop tabs 154 and 156 (FIGS. 6 and 11) formed on the base portion 46. The stop tabs 154 and 156 (FIG. 11) extend perpendicular to the outwardly facing major side surface 126 on the body section 122 of the base portion 46. Each surface 158 and 160 on the stop tabs 154 and 156 engage the inner side surface 128 (FIGS. 7 and 8) on the end wall 86 of the main section 34 of the container 22

The stop tabs 154 and 156 retain the lower hinge plate 50 against sideward movement in the channel 124 (FIG. 11). In addition, the stop tabs 154 and 156 guide the lower hinge plate 50 during movement of the lower hinge plate between the retracted position of FIGS. 5 and 6 and the extended position of FIGS. 9 and 10. Although the stop tabs 154 and 156 have a relatively short vertical extent, it is contemplated that the vertical extent of the stop tabs 154 and 156 could be increased to provide greater areas of engagement between the stop tabs and the opposite sides of the lower hinge plate 50.

It is contemplated that during assembly of the container 22, it may be desired to first mount the base portion 46 of the hinge assembly 44 in the main section 34 of the container. Thereafter, the lower hinge plate 50 would be positioned in the channel 124. To enable this to be accomplished, the projections 150 and 152 (FIG. 10) on the lower hinge plate 50 are disposed on flexible sections 164 and 166 of the lower hinge plate 50.

Cam surfaces 170 and 172 are formed on the flexible sections 164. The cam surfaces 170 and 172 engage the stop tabs 154 and 156 and resiliently compress the flexible sections 164 and 166 of the lower hinge plate 50 inwardly as the lower hinge plate is pressed downwardly against the stop tabs 154 and 156. After the lower hinge plate has been moved downwardly past the stop tabs 154 and 156, the resilient sections 164 and 166 spring outwardly to the position shown in FIG. 10.

The upper hinge plate 52 is connected with the lower hinge plate 50 by the pivot connection 54. The upper hinge plate 48 has a mounting section 176 which is fixedly connected to the cover section 26. The mounting section 176 extends perpendicular to a connector section 178 of the upper hinge plate 48. When the cover section 26 is in the closed condition of FIG. 3, the mounting section 176 is horizontal and the connector section 178 extends vertically. If desired, the mounting section 176 could be eliminated and the connector section 178 fixedly secured directly to the cover section 26.

The pivot connection 54 between the upper hinge plate 48 and lower hinge plate 50 includes a plurality of knuckles 184, 186 and 188 (FIG. 10) which are integrally formed with the upper hinge plate 52 and a plurality of knuckles 190 and 192 which are integrally formed with the lower hinge plate 50. A hinge pin 194 extends through the knuckles 184–192 to interconnect the upper and lower hinge plates 50 and 52 in a well known manner.

CONCLUSION

The present invention provides a new and improved container 22 having a cover section 26 which is connected with a main section 34 of the container by a hinge assembly 44. The hinge assembly 44 includes a base portion 46 and a pair of hinge plates 50 and 52 which are pivotally interconnected. A first one of the hinge plates 50 is slidable along a linear path relative to the base portion 46 of the hinge assembly 44. This allows the cover section 26 to move along a linear path relative to the main section 34 of the container 22. Linear movement of the cover section 26 enables a seal 58 between the cover section and main section 34 of the container 22 to be uniformly compressed upon closing of the container.

The two hinge plates 50 and 52 are pivotally interconnected. This enables the cover section 26 to be pivoted to an open position offset to one side of an opening 40 in the main section 34 of the container 22. When the cover section 26 has been pivoted to the open position, electrical circuitry 70 or other items within the container 22 are readily accessible through the opening 40 in the main section 34 of the container.

Having described the invention, the following is claimed:

1. A container comprising a main section having surfaces for defining an opening, a cover section for blocking the opening in said main section, a hinge assembly interconnection said main and cover sections, said hinge assembly including a base portion fixedly connected with a first one of said main and cover sections, and a connector portion connected with a second one of said main and cover sections, said connector portion of said hinge assembly including first and second hinge plates and means for pivotally interconnecting said first and second hinge plates, said first hinge plate and said base portion being slidable relative to each other along a linear path from a retracted condition in which said cover section blocks the opening in said main section to an extended condition in which said cover and main sections are at least partially spaced apart from each other, said first and second hinge plates being pivotally movable relative to each other along an arcuate path about the pivot connection from a first condition to a second condition when said first hinge plate and base portion are in the extended condition, said cover section being disposed adjacent to and at least partially blocking the opening in said main section when said first and second hinge plates are in the first condition, said cover section being offset to one side of the opening in said main section when said first and second hinge plates are in the second condition to provide access to said main section through the opening, a first electrical circuit board mounted on said cover section, a second electrical circuit board mounted on said main section, and flexible conductor means for conducting electrical energy between said first and second electrical circuit boards, said flexible conductor means for conducting electrical energy between said first electrical circuit board adjacent to said hinge assembly and a second end portion connected with said second electrical circuit board adjacent to said hinge assembly, said first and second end portions of said flexible conductor means being spaced a first distance apart when said first hinge plate and base portion of said hinge assembly are in the retracted condition, said first and second end portions of said flexible conductor means being spaced a second distance apart when said first hinge plate and base portion of said hinge assembly are in the extended condition, said second distance being greater than said first distance, said first and second end portions of said flexible conductor means being spaced a third distance apart when said first and second hinge plates have been pivoted relative to each other about the pivot connection to the second condition, said third distance being greater than said second distance.

2. A container as set forth in claim 1 wherein said first hinge plate has a first major side surface which is disposed in abutting engagement with an inner surface of said main section and a second major side surface which is disposed in abutting engagement with a surface on said base portion which faces toward the inner surface of said main section, said first major side surface on said first hinge plate being slidable along the inner surface of said main section and said second major side surface on said first hinge plate being slidable along the surface on said base portion which faces toward the inner surface of said main section during movement between said first hinge plate and base portion from the retracted condition to the extended condition.

3. A container as set forth in claim 1 further including seal means for sealing a joint between said cover section and said main section when said first hinge plate and base portion of said hinge assembly are in the retracted condition to prevent exposure of said first and second electrical circuit boards to contaminants, and means for interconnecting said cover section and said main section to compress said seal means between said cover section and said main section when said first hinge plate and base portion of said hinge assembly are in the retracted condition.

4. A container as set forth in claim 3 wherein said means for interconnecting said cover section and said main section includes a plurality of externally threaded fasteners which extend through openings in said cover section into engagement with internal threads connected with said main section when said first hinge plate and base portion of said hinge assembly are in the retraced condition.

5. A container as set forth in claim 1 further including display means mounted on said cover section and electrically connected with said first electrical circuit board for providing a visually readable output when said first hinge plate and base portion of said hinge assembly are in the retracted condition.

6. A container as set forth in claim 5 further including electrical connector means mounted on said main section and electrically connected with said second electrical circuit board for conducting electrical energy between said second electrical circuit board and conductors connected with said electrical connector means.

7. A container as set forth in claim 1 wherein said base portion and first hinge plate have stop surfaces which are engageable to limit movement of said connector portion of said hinge assembly relative to the first one of said base and cover sections upon movement of said first hinge plate and said base portion to the extended condition.

8. A container as set forth in claim 1 wherein said first hinge plate includes a first stop surface disposed on a first end portion of said first hinge plate, said first hinge plate having a second end portion opposite from said first end portion and pivotally connected with said second hinge plate, said base portion of said hinge assembly having a second stop surface which is spaced apart from said first stop surface when said first hinge plate and said base portion are in the retracted condition, said first and second stop surfaces being disposed in abutting engagement when said first hinge plate and said base portion are in the extended condition.

9. A container as set forth in claim 8 wherein said first hinge plate has a first major side surface which is disposed in abutting engagement with an inner surface of said first one of said main and cover sections and a second major side surface which is disposed in abutting engagement with a surface on said base portion which faces toward the inner surface of said first one of said main and cover sections, said first major side surface on said first hinge plate being slidable along the inner surface of said first one of said main and cover sections and said second major side surface on said first hinge plate being slidable along the surface on said base portion which faces toward the inner surface of said first one of said main and cover sections during relative movement between said first hinge plate and said base portion from the retracted condition toward the extended condition.

10. A container as set forth in claim 9 wherein said first stop surface on said first hinge plate extends between said first and second major side surfaces on said first hinge plate.

11. A container as set forth in claim 10 wherein said base portion includes a stop tab which extends away from the surface of said base portion which faces toward the inner surface of said first one of said main and cover sections, said stop tab having an end surface which extends transversely to said second stop surface and abuttingly engages the inner surface of said first one of said main and cover sections, said stop tab, inner surface of said first one of said main and cover sections and surface of said base portion which faces toward the inner surface of said first one of said main and cover sections cooperating to at least partially define a channel in which said first hinge plate is slidably received, said second stop surface being disposed on said stop tab and extending transversely to said end surface of said stop tab.

12. A container as set forth in claim 11 wherein said base portion includes a body section which extends along the inner surface of said first one of said main and cover sections, said stop tab being connected with and extending in a first direction from said body section, said base portion including a support section which extends in a second direction from said body section opposite to said first direction, said hinge assembly further including fastener means for connecting said support section with said first one of said main and cover sections.

13. A container as set forth in claim 12 wherein said second hinge plate includes a first section having a first end portion which is connected with said first hinge plate by said means for pivotally interconnecting said first and second hinge plates, said second hinge plate having a second section which extends transversely outwardly from a second end portion of said first section of said second hinge plate.

14. A container as set forth in claim 1 wherein said means for pivotally interconnecting said first and second hinge plates includes a hinge pin having a longitudinal central axis which extends perpendicular to the linear path along which said first hinge plate and said base portion are slidable relative to each other from the retracted condition to the extended condition.

15. A container as set forth in claim 1 wherein said base portion has a flat major side surface, said first hinge plate having a flat major side surface which is disposed in abutting engagement with the flat major side surface of said base portion, said flat major side surfaces of said base portion and said first hinge plate being slidable relative to each other during relative movement of said first hinge plate and base portion between the retracted and extended conditions.

16. A container as set forth in claim 15 wherein said main section has a flat side surface which faces toward the flat major side surface on said base portion, said flat side surface on said main section cooperating with the flat major side surface of said base portion to at least partially define a channel in which said first hinge plate is slidably received.

17. A container as set forth in claim 1 wherein said means for pivotally interconnecting said first and second hinge plates moves from a position adjacent to said first one of said main and cover sections to a second position spaced from said first one of said main and cover sections upon relative movement of said first hinge plate and base portion from the retracted condition to the extended condition.

18. A container comprising a main section having walls for defining an opening, a cover section for blocking the opening in said main section, said cover section being movable relative to said main section between a closed condition in which said cover section blocks the opening in said main section and an open condition in which said cover section is ineffective to block the opening in said main section, seal means extending around said opening for sealing a joint between said cover section and main section when said cover section is in the closed condition, and a hinge assembly interconnecting said cover and main sections for enabling at least a portion of said cover section to move toward and away from said main section along a path having a linear portion and an arcuate portion during movement of said cover section between the open and closed conditions, said cover section being movable along the linear portion of the path to compress said seal means between said cover and main sections during a final portion of movement of said cover section from the open condition to the closed condition, said hinge assembly including a base portion fixedly connected with said main section and a connector portion connected with said cover section, said connector portion of said hinge assembly including first and second hinge plates and means for pivotally interconnecting said first and second hinge plates, said first hinge plate having a first major side surface which is disposed in abutting engagement with an inner surface of said main section and a second major side surface which is disposed in abutting engagement with a surface on said base portion which faces toward the inner surface of said main section, said first major side surface on said first hinge plate being slidable along the inner surface of said main section and said second major side surface on said first hinge plate being slidable along the surface on said base portion which faces toward the inner surface of said main section during movement of at least a portion of said cover section along the linear portion of the path, further including a first electrical circuit board mounted on said cover section, a second electrical circuit board mounted on said main section, and flexible conductor means for conducting electrical energy between said first and second electrical circuit boards, said flexible conductor means having a first end portion connected with said first electrical circuit board adjacent to said hinge assembly and a second end portion connected with said second electrical circuit board adjacent to said hinge assembly.

19. A container as set forth in claim 18 further including fastener means for interconnecting said cover section and said main section when said cover section is in the closed condition, said fastener means including a plurality of externally threaded fasteners which extend through openings in said cover section into engagement with internal threads connected with said main section.

20. A container as set forth in claim 18 wherein said base portion and first hinge plate have stop surfaces which are engageable to limit movement of said connector portion of said hinge assembly relative to said base section upon movement of said cover section along the linear portion of the path in a direction away from said main section.

21. A container as set forth in claim 18 wherein said first hinge plate includes a first stop surface disposed on a first end portion of said first hinge plate, said first hinge plate having a second end portion opposite from said first end portion and pivotally connected with said second hinge plate, said base portion of said hinge assembly having a second stop surface which is spaced apart from said first stop surface when said cover section is in the closed condition, said first and second stop surfaces being disposed in abutting engagement when said cover section is in the open condition.

22. A container as set forth in claim 21 wherein said first stop surface on said first hinge plate extends between said first and second major side surfaces on said first hinge plate.

23. A container as set forth in claim 22 wherein said base portion includes a stop tab which extends away from the surface of said base portion which faces toward the inner surface of said main section, said stop tab having an end surface which extends transversely to said second stop surface and abuttingly engages the inner surface of said main section, said stop tab, inner surface of said main section and surface of said base portion which faces toward the inner surface of said main section cooperating to at least partially define a channel in which said first hinge plate is slidably received, said second stop surface being disposed on said stop tab and extending transversely to said end surface of said stop tab.

24. A container as set forth in claim 23 wherein said base portion includes a body section which extends along the inner surface of said main section, said stop tab being connected with and extending in a first direction from said body section, said base portion including a support section which extends in a second direction from said body section opposite to said first direction, said hinge assembly further including fastener means for connecting said support section with said main section.

25. A container as set forth in claim 24 wherein said second hinge plate includes a first section having a first end portion which is connected with said first hinge plate by said means for pivotally interconnecting said first and second hinge plates, said second hinge plate having a second section which extends transversely outwardly from a second end portion of said first section of said second hinge plate.

26. A container as set forth in claim 1 further including display means mounted on said cover section and electrically connected with said first electrical circuit board for providing a visually readable output.

* * * * *

UNITED STATES PATENT AND TRADEMARK OFFICE
CERTIFICATE OF CORRECTION

PATENT NO.   : 5,255,807
DATED        : October 26, 1993
INVENTOR(S)  : Keith O. Satula, Charles J. Turner and John P. Groves It is certified that error appears in the above-identified patent and that said Letters Patent is hereby corrected as shown below:

Column 7, line 55, change "interconnection" to --interconnecting--.

Column 8, line 17, change "for conducting electrical energy between" to --having a first end portion connected with--.

Column 12, line 44, change "1" to --18--.

Signed and Sealed this

Twenty-sixth Day of April, 1994

Attest:

BRUCE LEHMAN

*Attesting Officer*        *Commissioner of Patents and Trademarks*